United States Patent [19]

Ueda et al.

[11] Patent Number: 4,831,278
[45] Date of Patent: May 16, 1989

[54] WIRE HARNESS FOR AUTOMOBILE

[75] Inventors: Shinichi Ueda; Michihiro Ohtaka; Yoshiaki Nakayama, all of Susono, Japan

[73] Assignee: Yazaki Corporation, Tokyo, Japan

[21] Appl. No.: 233,911

[22] Filed: Aug. 16, 1988

Related U.S. Application Data

[63] Continuation of Ser. No. 16,965, Feb. 24, 1987, which is a continuation of Ser. No. 780,419, Sep. 26, 1985.

[30] Foreign Application Priority Data

Sep. 28, 1984 [JP] Japan .................................. 59-201979
May 29, 1985 [JP] Japan ............................. 60-079394[U]
Sep. 28, 1985 [JP] Japan .................................. 59-201980

[51] Int. Cl.$^4$ ............................ H02B 1/20; H02J 1/00
[52] U.S. Cl. ................................ 307/10.1; 174/72 A; 174/71 R; 174/72 R
[58] Field of Search ................. 307/10 R, 10 LS, 149, 307/148, 150, 9; 361/414, 412, 426, 427, 428; 174/68.5, 71 R, 72 R, 72 A, 117 FF; 180/90; 296/70; 340/52 R, 52 F, 52 D; 200/5 R, 5 A, 5 B, 5 C, 5 D

[56] References Cited

U.S. PATENT DOCUMENTS

| | | | |
|---|---|---|---|
| 3,009,010 | 11/1961 | Stearns et al. | 174/68.5 X |
| 3,042,137 | 7/1962 | Matheus et al. | 361/417 X |
| 3,697,767 | 10/1972 | Fioravanti | 307/10 LS X |
| 3,757,029 | 9/1973 | Marshall | 174/117 FF X |
| 3,818,119 | 6/1974 | Sutherland et al. | 174/117 FF X |
| 3,836,415 | 9/1974 | Hilderbrandt | 174/72 A X |
| 3,952,209 | 4/1976 | Shaklee et al. | 307/9 |
| 4,051,383 | 9/1977 | Dola | 307/10 LS X |
| 4,065,199 | 12/1977 | Ander et al. | 174/72 A X |
| 4,122,357 | 10/1978 | Sumida | 174/72 A X |
| 4,156,151 | 5/1979 | Borroni | 307/12 X |
| 4,177,497 | 12/1979 | McCook et al. | 174/72 A X |
| 4,255,612 | 3/1981 | Grundfest | 174/117 FF X |
| 4,280,062 | 7/1981 | Miller et al. | 307/10 LS |
| 4,403,155 | 9/1983 | Aoki et al. | 307/10 R |
| 4,781,255 | 11/1988 | Lock et al. | 174/72 A X |

FOREIGN PATENT DOCUMENTS

| | | | |
|---|---|---|---|
| 2256948 | 5/1973 | Fed. Rep. of Germany | 174/68.5 |
| 2851858 | 5/1979 | Fed. Rep. of Germany | 174/72 A |
| 939394 | 10/1963 | United Kingdom | 174/68.5 |
| 1193420 | 6/1970 | United Kingdom | 307/10 R |

OTHER PUBLICATIONS

Flexprint bmc pamphlet, Buckabee Mears Co., Saint Paul, Minn., received 03/15/59 at the office in 174/68.5(2 sides).
Ardito et al., MAKING INTEGRAL MULTILAYER CIRCUIT BOARDS WITH CABLE CONNECTIONS, IBM Tech. Disc. Bull., vol. 14 190 3, Aug. 1971, pp. 701 & 702.

Primary Examiner—William M. Shoop, Jr.
Assistant Examiner—Paul Ip
Attorney, Agent, or Firm—Brumbaugh, Graves, Donohue & Raymond

[57] ABSTRACT

A wire harness can be replaced partly or in its entirety with a circuit board which is composed of an insulator substrate and a plurality of conductive strip members provided thereon. The above mentioned conductive strip members are arranged on the insulator substrate parallel with each other. This parallel arrangement of the conductive strips corresponds to bundling of wires in a wire harness. By providing branch paths extending from the conductive strip members, the circuit board can replace a substantial part of the wire harness.

7 Claims, 13 Drawing Sheets

F I G. 1
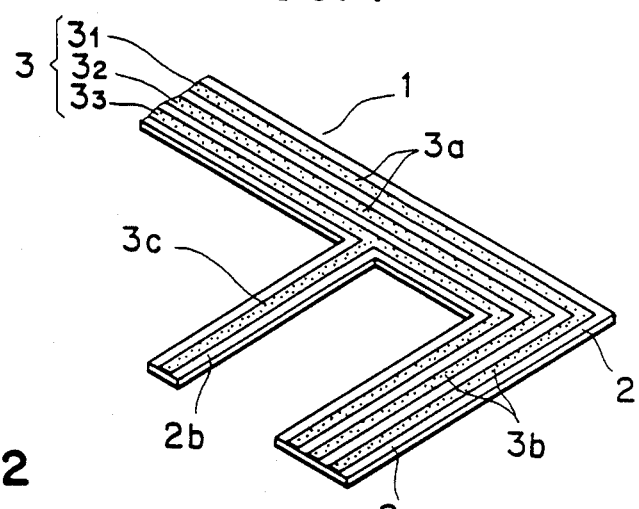
F I G. 2
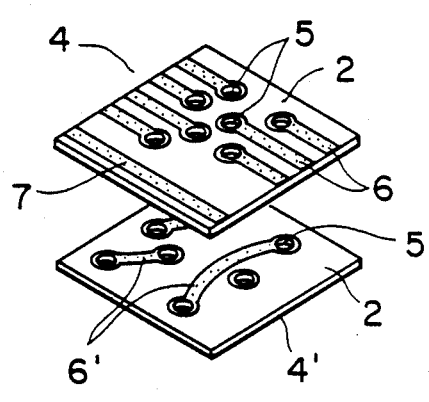
F I G. 3
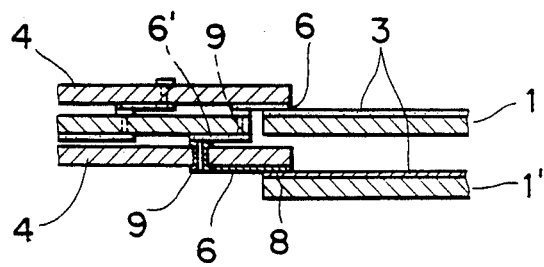

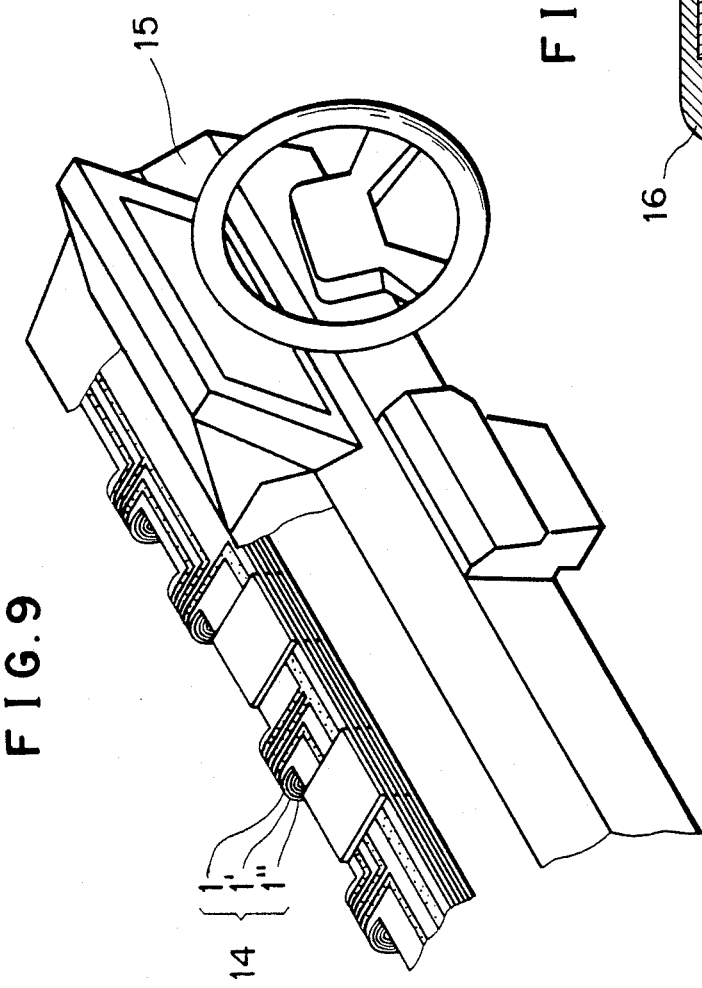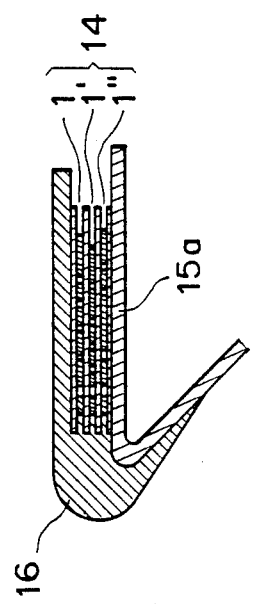

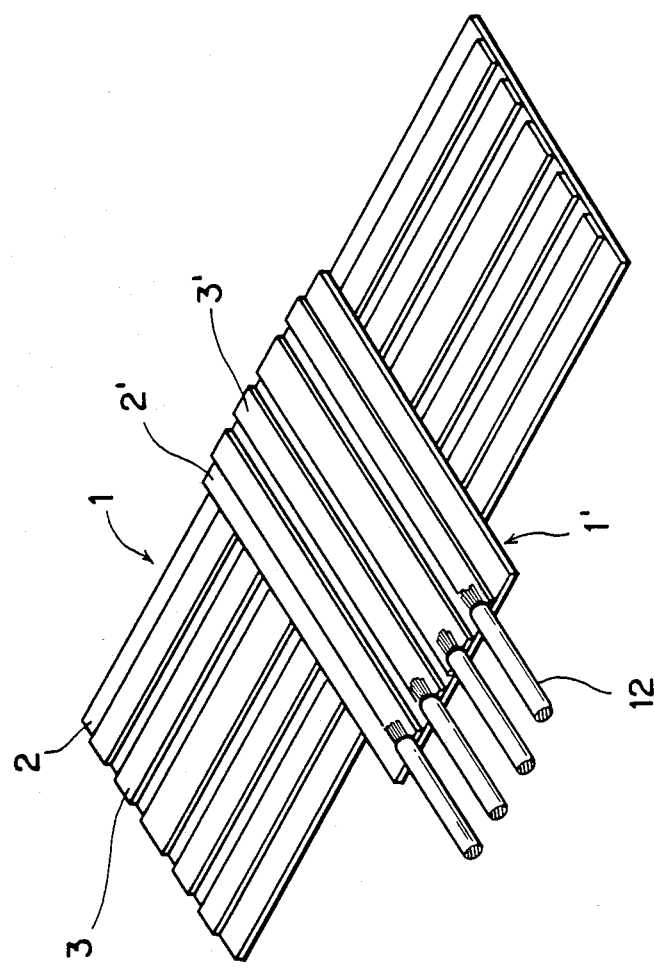

WIRE HARNESS FOR AUTOMOBILE

This application is a continuation of application Ser. No. 016,965, filed on 2/24/87, which in turn is a continuation of application Ser. No. 780,419, filed on 9/26/85.

BACKGROUND OF THE INVENTION

This invention relates to a circuit board which is capable of serving the purpose of a wire harness for an automobile. More particularly, the invention relates to a circuit board to replace at least part of a wire harness composed of a plurality of bundled wires, said wire harness having a design corresponding to a predetermined wiring pattern in an automobile structure so that the space occupied by the wire harness is reduced, the wiring thereof may be made with ease, and productivity may be increased.

A conventional wire harness is formed by determining the wiring path thereof in advance, and tying the electric wires into a bundle. One such example is shown in FIG. 19, wherein a denotes an electric wire, b denotes a vinyl tape, and c denotes a connector. A wire harness A has a plurality of subharnesses e branching from a main harness d. In this way, it has a complicated construction. FIG. 20 shows the placement of wiring harness A in an automobile B wherein the harness A is arranged along a predetermined wiring path, so that it lies along portions of various constructions, shapes, etc. in the automobile B, and fixed to a vehicle body by clips, clamps, etc. (not shown).

Prior wire harness have become bulkier and bulkier due to ever increasing numbers of eletronic parts to be mounted on an automobile. Moreover, due to the space requirements of the electric items themselves, the wire harness often interferes with various parts and the vehicle body, which makes it difficult to obtain a sufficient space for wiring. Furthermore, as the wire harness becomes larger and its weight increases, difficulties in the manufacturing process, mounting process, etc. are increased, resulting in the following problems.

(1) Electric wires constituting a wire harness have many different diameters and lengths, and branching electric wires for connecting auxiliaries originate from various points on the main harness. Accordingly, working processes are increased and automation is difficult to obtain.

(2) Different wire harnesses are required to be made according to different specifications and grades of an automobile, even if its type and model are same. Accordingly, they are extremely complicated to manufacture and to control.

(3) When electric wires are joined together, such additional tasks as peeling off the insulation, pressure welding of joint terminals, and wrapping of insulated tapes to joint portions are required. Furthermore, the joint portions are enlarged due to the above mentioned terminals, insulated tapes, etc. Accordingly, the shape of the wire harness becomes irregular.

(4) There is a tendency that wire harnesses are made even larger according to increase of the number of circuits. Accordingly, if the wire harnesses should remain in their present form, their wiring would become more and more difficult, which eventually results in a reduced space in an automobile.

The present invention solves the above mentioned problems inherent in the prior art. In particular, the enlarged portions of the wire harness, for example, the portion where electric wires are concentrated (main harness d in FIG. 19) and branch points (sub-harness in FIG. 19), are made flat just like a usual printed circuit board (P.C.B) and a flexible printed circuit board (F.P.C).

SUMMARY OF THE INVENTION

It is therefore a general object of the present invention to provide a circuit board to replace at least part of a wire harness for an automobile such that the wiring can easily be effected without taking up much space.

Another object of the invention is to provide a circuit board to replace at least part of a wire harness for an automobile, wherein all branch points of a conventional wire harness can be contained on the circuit board.

A futher object of the invention is to provide a circuit board to replace at least part of a wire harness for an automobile, wherein such working processes as peeling off the jackets of electric wires, pressure welding of joint terminals, etc. are no longer required.

A still further object of the invention is to provide a circuit board to replace at least part of a wire harness for an automobile, wherein a circuit board is formed in a shape of a plain board.

A still further object of the present invention is to provide a circuit board to replace at least part of a wire harness for an automobile such that said circuit board can be integrally molded with, for example, the wall surface of an instrument panel.

An additional important object of the present invention is to provide a wire harness for an automobile, such that wiring can be easily done by simple application of a circuit board, even if additional electric items are employed, or models or grades of an automobile are changed.

In order to achieve the above objects, there is provided a circuit board to replace at least part of a wire harness composed of a plurality of bundled wires, said wire harness having a design corresponding to a predetermined wiring pattern in an automobile structure. Said circuit board comprises an insulator substrate having first and second sides and generally having a predetermined design in accordance with a wiring pattern; and conductive strip members provided on one of said first and second sides of the insulator substrate, said strip members being substantially parallel with each other to form a plurality of circuit patterns.

There is also provided a laminated circuit board to replace at least part of a wire harness composed of a plurality of bundled wires, said wire harness having a design corresponding to a wiring pattern within an automobile structure. Said laminated circuit board comprising a plurality of insulator substrates having first and second sides, each insulator substrate generally having a predetermined design in accordance with a wiring pattern; and conductive strip members provided on one of said first and second sides of each insulator substrate, said conductive strip members being arranged substantially parallel with each other to form a plurality of circuit patterns. The insulator substrates are piled up one on top of another such that said insulator substrates and said conductive strip members thereon alternate. The insulator substrates include a first insulator substrate and a second insulator substrate provided on top of said first insulator substrate, at least one of said plurality of conductive strip members of the first insulator substrate being connected to at least one of said plurality of conductive strip members of the second insulator substrate.

The above and other objects, novel features and advantages of the present invention will become more apparent from the description of a preferred embodiment of the invention. The description makes reference to the drawings.

BRIEF DESCRIPTION OF THE DRAWINGS

FIG. 1 is a perspective view of an important portion of a laminated circuit board according to a first preferred embodiment of the present invention;

FIG. 2 is likewise a perspective view of interlayer connection boards;

FIG. 3 is a sectional view showing connection of the interlayer connection boards and the laminated circuit board;

FIG. 5 is a plan view of a laminated circuit board according to a second preferred embodiment of the present invention;

FIG. 9 is a perspective view showing an example of the wiring of a circuit board according to the present invention;

FIG. 10 is a sectional view showing a part of FIG. 9;

FIG. 15 is a further embodiment of the circuit board according to the present invention, in which the circuit board is composed of two insulator substrates having conductive strip members extending perpendicularly to each other therein;

DETAILED DESCRIPTION OF THE EMBODIMENTS

Figure 4:
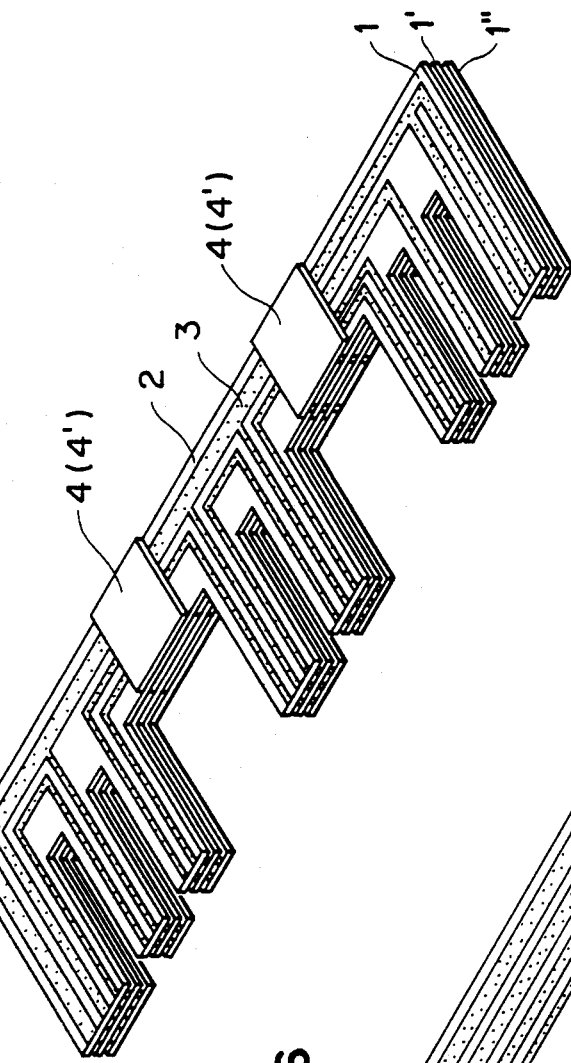
FIG. 4 is a perspective view showing a laminated circuit board.

Preferred embodiments of the present invention will be described hereunder with reference to the accompaying drawings.

FIG. 1 is a plan view of a laminated circuit board according to the present invention, and FIG. 2 is a perspective view showing the stacking of layers therein.

A laminated circuit board 1 comprises insulated substrates 2 and a plurality of conductive strip members 3 arranged substantially parallel with each other thereon.

Each insulated substrate 2 is formed in a band shape using an insulator material such as, film such as polyester, polyimide resin, etc., paper phenol, glass epoxy, etc. which are used for known printed circuit boards. Preferably, a film shaped insulator material should be employed to achieve light weight and small size, and also for convenience of wiring. The insulator substrate 2 has extensions $2a$ and $2b$ corresponding to wiring paths of a wire harness.

The conductive strip member 3 is formed in a band shape having a uniform thickness but different widths corresponding to current carrying capacities using a metallic conductor such as copper, aluminum, etc. The conductive strip member 3 is formed in the desired circuit pattern corresponding to the wiring path of a wire harness.

In FIG. 1, the conductive strip members $3_1$, $3_2$ and $3_3$ have different widths, respectively. A linear path $3a$ is provided at its end portion with an extension $3b$. At the same time, the member $3_3$ is formed in a branch shape having a branch path $3c$. In this way, even in the case one path is required to connect to many auxiliaries, switches, etc., a simple alteration of the circuit pattern can meet with all these requirements with ease.

Accordingly, the circuit patterns of the conductive strip member 3 arranged in the circuit board 1 are classified in the following three categories. That is, (i) function of the circuits, (ii) actuation of loads, and (iii) combination of the foregoing. And, a most suitable pattern is selected among them so that the maximum effect can be obtained.

The "function of the circuits" means that in view of functions of circuits such as power circuits for various kinds of electric items (loads) mounted on an automobile, earth circuit, signal control circuit, meter circuit, etc., a sheet of circuit board which covers respective functions of the circuits is formed. The "actuation of loads" means that a sheet of circuit board is formed using all of such circuits as power circuits for actuating loads such as, for example, a wiper, etc., and earth circuit, signal circuit, switch circuits, etc. The "combination of the foregoing" means that a multifunction circuit board is formed by suitably combining the foregoing circuits, and a most effective circuit pattern such as light weight and small size is designed in view of the whole wiring paths of the wire harness.

FIG. 2 is a perspective view of interlayer connection boards. One of the interlayer connection boards 4 is provided with a conductive interlayer connection strip member 6 extending in the lateral direction from a plurality of through holes 5 formed in the central portion of the insulation substrate 2, and a conductive strip member 7 having no through hole. The other interlayer connection board 4' comprises the insulator substrate 2 and a plurality of conductive interlayer connection strip members 6' each having the through holes at both its ends. These boards 4, 4' may be either a single faced board or a double faced board, and can be used for connecting the upper and lower interlayers of the laminated circuit boards and for connecting the adjacent circuit boards. The interlayer connection circuits 6, 6' and 7 are formed of the same material as the conductive strip member 3.

FIG. 3 is a sectional view showing an upper and lower interlayer connection state when the circuit boards are stacked. That is, end portions of the conductive strip members 3, 3 of the upper and lower circuit boards 1, 1' are direcly connected with the circuits 6, 6 of the interlayer connection board 4, 4 by soldering 8, and a grommet 9 is inserted in the through hole 5 for fixture. Instead of the grommet 9, a rivet, pin, soldering, etc. may be used. Likewise, instead of soldering 8 for connecting the conductive strip member 8 and the circuit 6, they may be directly connected by screw means, anisotropic conductive rubber, welding, conductive adhesive agent, etc., or otherwise indirectly connected by connectors, etc. as will be described.

FIG. 4 illustrates layers of the laminated circuit board 1, 1', 1" which were formed as shown in FIG. 1. The respective circuit boards are classified in view of the above mentioned "function of the circuits", "actuation of the loads", etc., and are connected between the upper and lower layers or adjacent circuit boards by the interlayer connection boards 4, 4'.

In this way, various connecting means of the circuit boards are made available by using the interlayer connection boards 4, 4'. Accordingly, for example, in the case the respective layers are separately disposed, electric power source wires, earth wires, signal wires, etc. may be collected in one layer, or on the contrary, they may be separately disposed according to necessity. Moreover, since the respective conductive strip members 3 arranged in the circuit boards can be divided in several circuit patterns, an individual circuit pattern of each of such dividied portion can be designed and manufactured.

Figure 6:
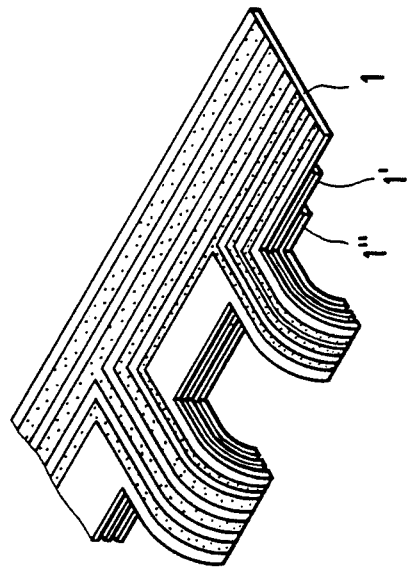
FIG. 6 is a perspective view showing a piling up state of the laminated circuit board of FIG. 5.

FIG. 5 is a plan view of a circuit board according to a second embodiment of the present invention, and FIG. 6 is a perspective view showing a stacked state thereof.

The circuit board 1 comprises an insulator substrate 2 and a plurality of conductive strip members 3 arranged thereon.

The insulator substrate 2 is formed in a band shape using an insulator material such as, film such as polyester, polyimide resin, etc., paper phenol, glass epoxy, etc. which are used for a usual printed circuit board. Preferably, a film shaped insulator material should be employed in view of light weight and small size, and also for convenient purposes of wiring thereof. The insulator board 2 has T-shaped branch portions 2b corresponding to wiring paths of a wire harness.

The conductive strip member 3 is formed in a band shape having a uniform thickness but different narrow widths corresponding to current carrying capacities using a metallic conductor such as copper, aluminum, etc. The conductive strip member 3 is constituted to include a desired circuit pattern corresponding to the wiring path of a wire harness. In the figure, the conductive strip members $3_1$ through $3_2$ are formed in a linear shape having different widths, $3_3$ are formed in a branch shape having one branch path 3c, and $3_4$ through $3_8$ are formed in a L-shaped or yoke-shape having a bent path 3b respectively. Also, the conductive strip members $3_7$, $3_8$ are formed with branch paths 3c as in the case already described. Accordingly, even in the case one circuit is required to connect to many auxiliaries switches, etc., a simple alternation of the circuit pattern can meet with all these requirements with ease.

In FIG. 6, the plurality of circuit boards 1, 1', 1" . . . which were formed as mentioned above are stacked in several layers. The respective circuit boards are formed per respective circuits such as, for example, electric power source circuit, earth circuit, wiper circuit, meter circuit, etc. in a wire harness, and each of the respective layers is independent from one another in spite of multilayers.

Figure 7:
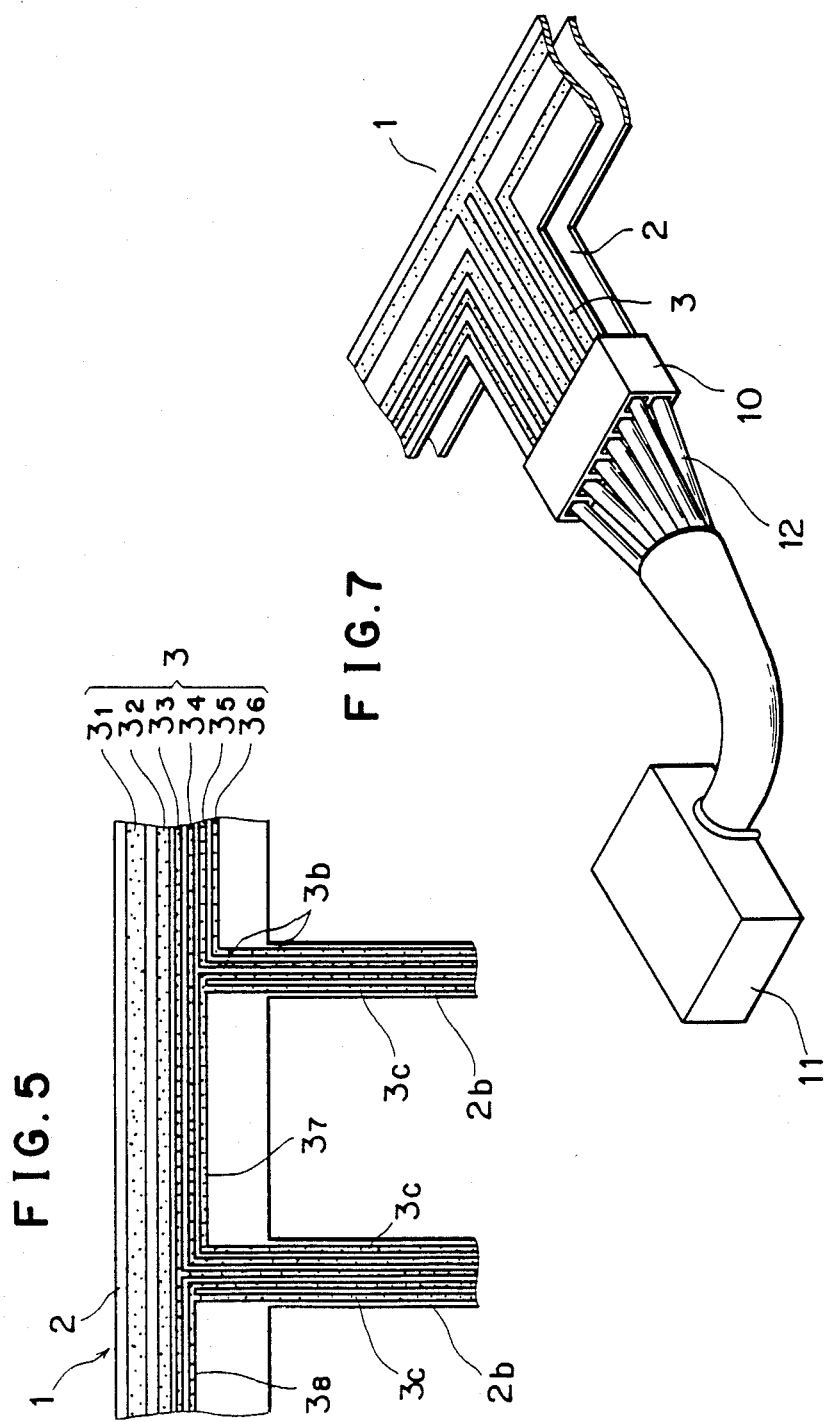
FIGS. 7 and 8 are schematic illustrations for explaining how to connect terminal portions of the laminated circuit board, respectively.
Figure 8:
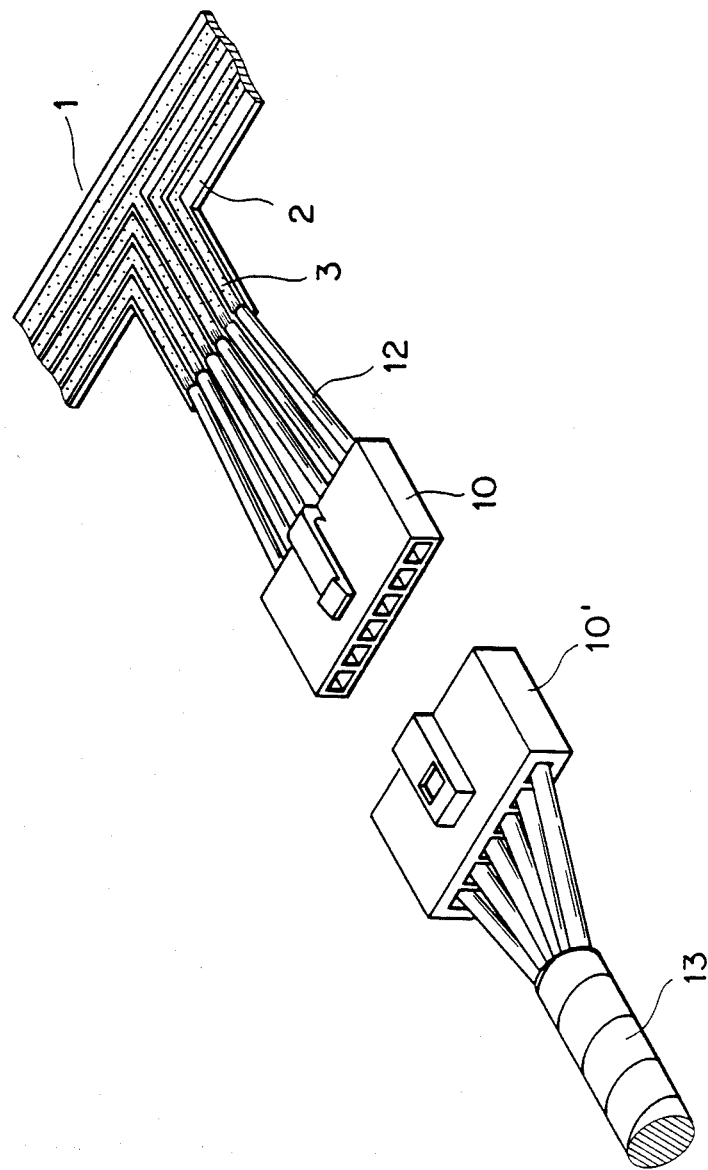

FIGS. 7 and 8 are schematic illustrations showing how to connect the terminal portions of the respective circuit boards.

That is, terminals of the conductive strip members 3 are connected with terminal elements (not shown) in the circuit board 1, so that they can be directly connected to auxiliaries 11 such as switches and various electronic devices by a connector 10 corresponding to the terminal elements. On the other hand, in the circuit board shown in FIG. 8, electric wires 12 are in permanent connection with the respective conductive strip members 3 by spot welding, soldering, etc. By providing a pair of female and male connectors 10, 10' at the end portion of these wires 12, they can be connected to a sub-harness 12, or a circuit signal can be taken out.

In FIG. 9, a wire harness 14 formed of the plurality of circuit boards 1, 1', 1" . . . shown in FIGS. 4 and 6 is wired within a pad of an instrument panel 15. FIG. 10 is a sectional view of FIG. 9, wherein 15a denotes a wall surface of the instrument panel 15, and 16 denotes an insulating foam material covering the wire harness 14. In this way, the flat-shaped circuit boards and/or the wire harness formed thereof can be integrally wired with a vehicle body of an automobile and articles mounted thereon by molding.

Figure 11A:
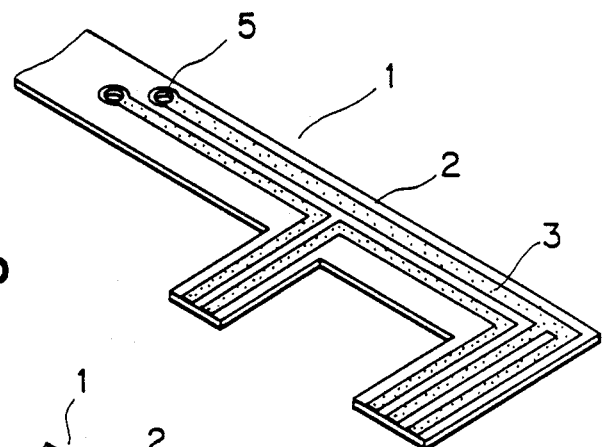
FIGS. 11a and 11b are perspective views showing an important portion of modified embodiments of circuit boards, respectively.
Figure 11B:
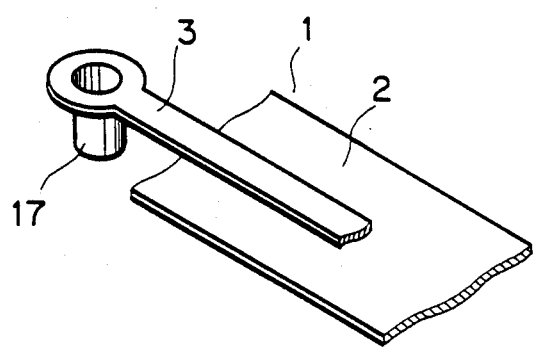

FIGS. 11a and 11b illustrate modified embodiments of interlayer connection means of the circuit board, respectively. In FIG. 11a, the conductive strip member 3 or its extension is directly formed with through holes 5. In FIG. 11b, the conductive member 3 projects from the insulator substrate 2, and a grommet 17 projects from the conductive strip member 3. In this case, the afore-mentioned interlayer connection boards 4, 4' are not required, or at least the number of them can be reduced extensively.

Figure 12:
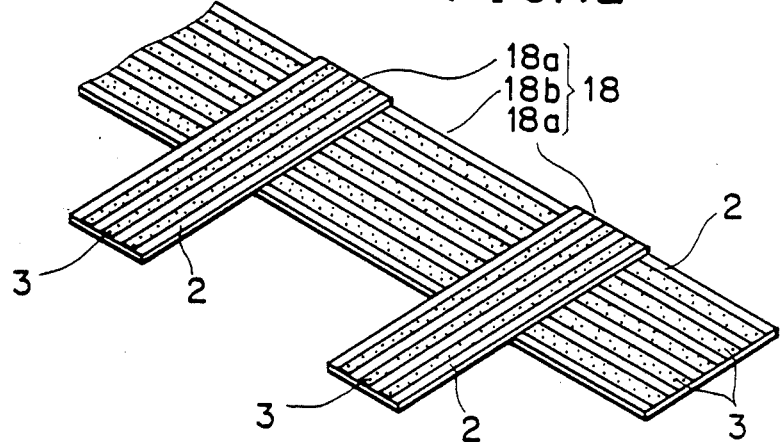
FIG. 12 is a perspective view showing another example of a laminated circuit board according to the present invention.
Figure 13:
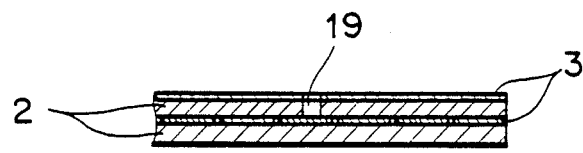
FIGS. 13 and 14 are sectional views showing how to connect the conductive strip members in the laminated circuit board of FIG. 12 respectively.
Figure 14:
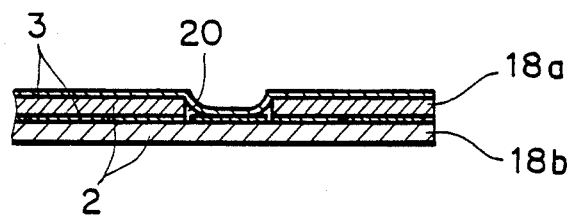

FIG. 12 illustrates another example of the circuit board according to the present invention. Different from those of FIG. 1 and FIG. 5, this circuit board 18 is separately formed in a vertical pattern circuit board and a horizontal pattern circuit board, so that multilayer effects thereof can be increased. And, the vertical and horizontal pattern circuit boards are connected with each other only at portions from where signals are required to be taken out. FIGS. 13 and 14 illustrate connecting means thereof, respectively. In FIG. 13, upper and lower circuit boards 18a, 18b are formed with a through hole 19 and connected with each other by soldering, screw means, rivets, grommets, pins, etc. Alternatively, in FIG. 14, the insulator substrate 2 of the vertical pattern circuit board 18a to be connected is formed with a hole 20 of a suitable size, and the upper and lower conductive strip members 3 are connected with each other by spot welding, etc.

Referring to FIGS. 15 through 18, a still further embodiment of the invention is explained. A first circuit board 1 is composed of a first insulator substrate 2 and a plurality of condutive strip members 3 which are linear and arranged parallel with each other on said first insulator substrate 2. Similarly, a second circuit board 1' is composed of a second insulator substrate 2' and a plurality of conductive strip members 3' which are linear and arranged parallel with each other on said second insulator substrate 2'. Said second circuit board 1' is stacked on said first circuit board 1 such that the conductive strip members 3 of the first circuit board 1 are oriented perpendicular to the conductive strip members 3' of the second circuit board 1'.

Figure 16:
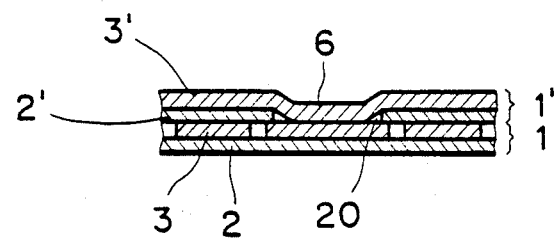
FIG. 16 is a sectional view showing how the conductive strip members on the two substrates are connected.

Referring to FIG. 16, the second insulator substrate 2' is formed with a through hole 20 at a predetermined position thereof such that a selected one of the conductive strip members 3 of the first circuit board 1 is exposed.

Through this hole, one of the conductive strip members 3' is connected to said exposed conductive strip member 3 by welding or soldering. For ease of welding or soldering, the conductive strip member 3 to be exposed of the first circuit board 1 may project upward or the conductive strip member 3' of the second circuit board 1' may be dented downward beforehand.

Conductive strip members 3 are of a narrow band shaped plate. The conductive strip members 3 are formed differently in cross sectional dimension according to current carrying capacites such as, for example, one with an equal thickness and a different width, or one with an equal width and a different thickness. Connection of the conductive strip members 3 with an outside portion, that is, connection thereof with other portions of a wire harness, switches, electronic equipment, and other electric articles thereof may be directly made at, for example, terminal portions formed in the electric articles, or as shown in FIG. 15, made through electric wires 12 by fixing (permanent connection) the electric wires 12 by welding, soldering, etc.

Figure 17:
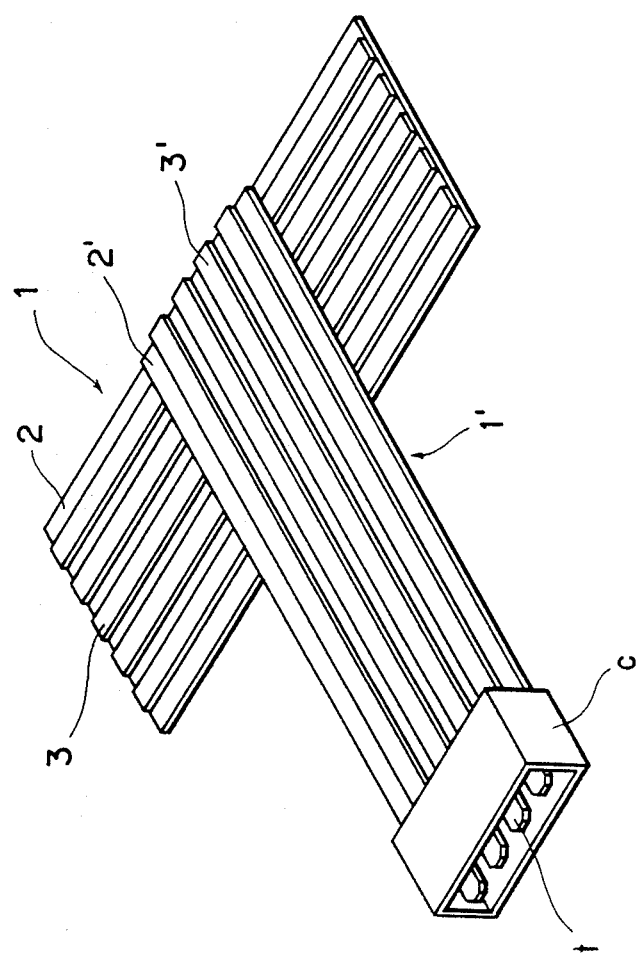
FIG. 17 is a perspective view of modified form of the embodiment.

FIG. 17 illustrates another mode of connection of the conductive strip members 3. The conductive strip member 3 is continuously formed at its end portion with a male terminal t which is protected and rested in a connector housing c. Instead of the male terminals 5, a female terminal for receiving a male terminal may be continuously formed to the member 3. In this case, since an outside terminal portion of the conductive strip member 3 is protected by the connector housing c, its maintenance is improved. At the same time, the above-mentioned electric articles and other connectors can be interconnected by one touch.

Figure 18:
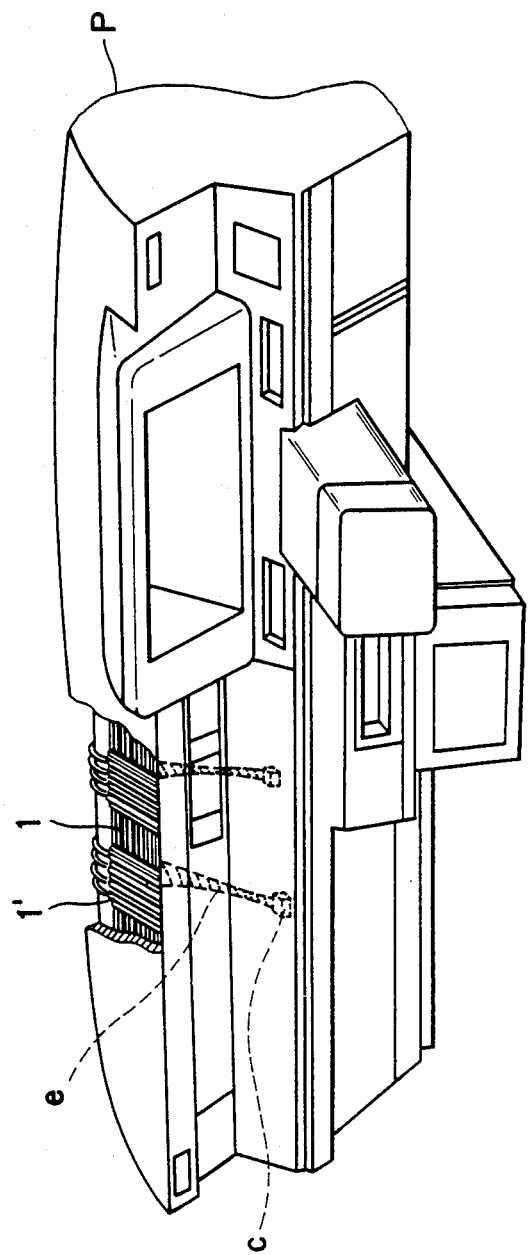
FIG. 18 is an illustration showing how the circuit board of the embodiment is build-in in the instrument panel.
Figure 19:
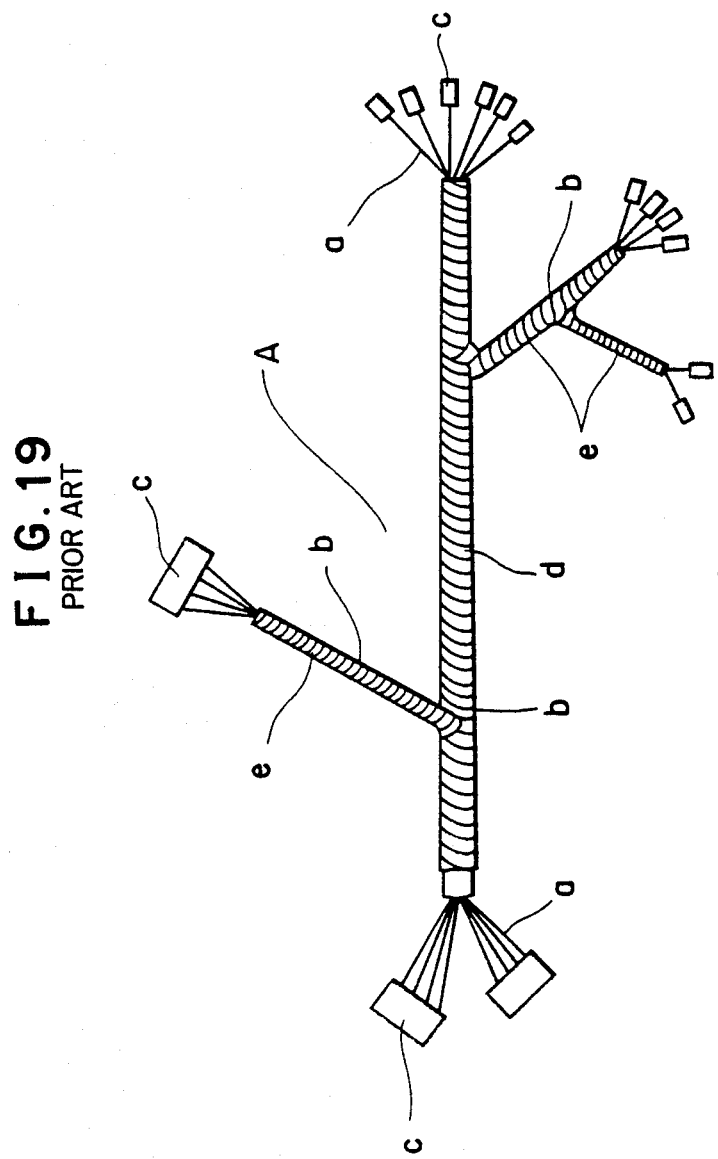
FIG. 19 is a schematic illustration for explaining a conventional wire harness.
Figure 20:
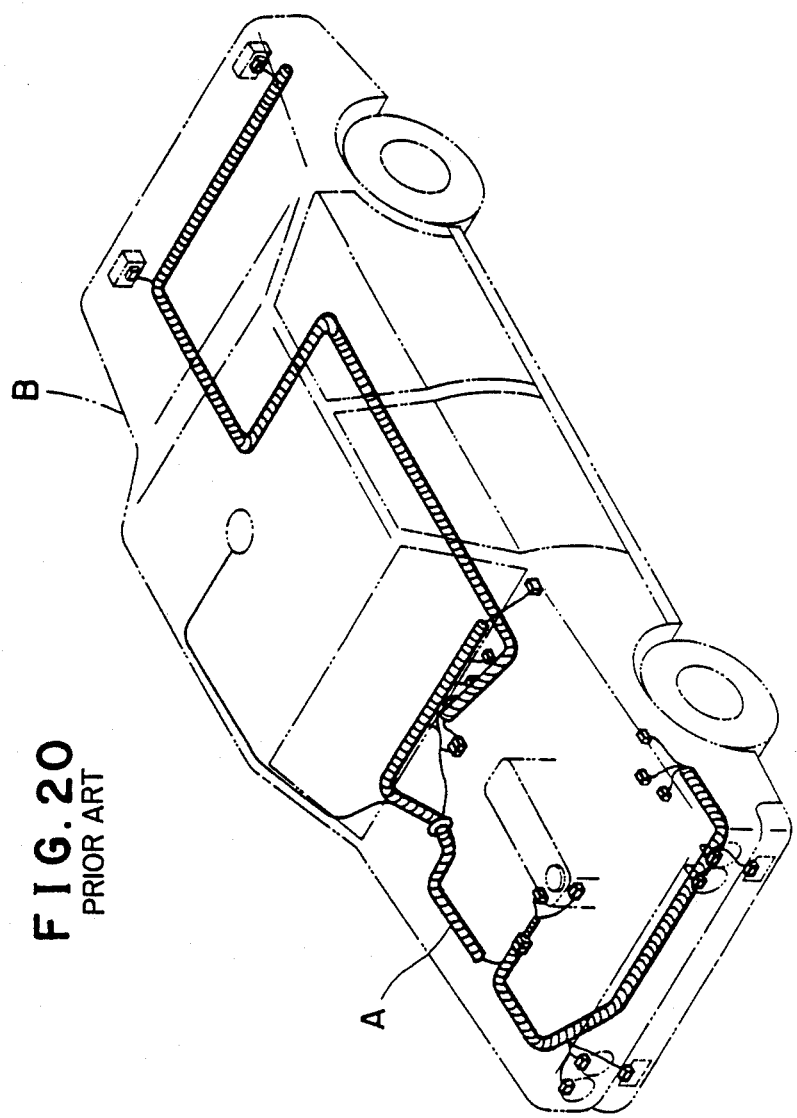
FIG. 20 is a schematic perspective view showing wiring of the conventional wire harness.
Figure 21:
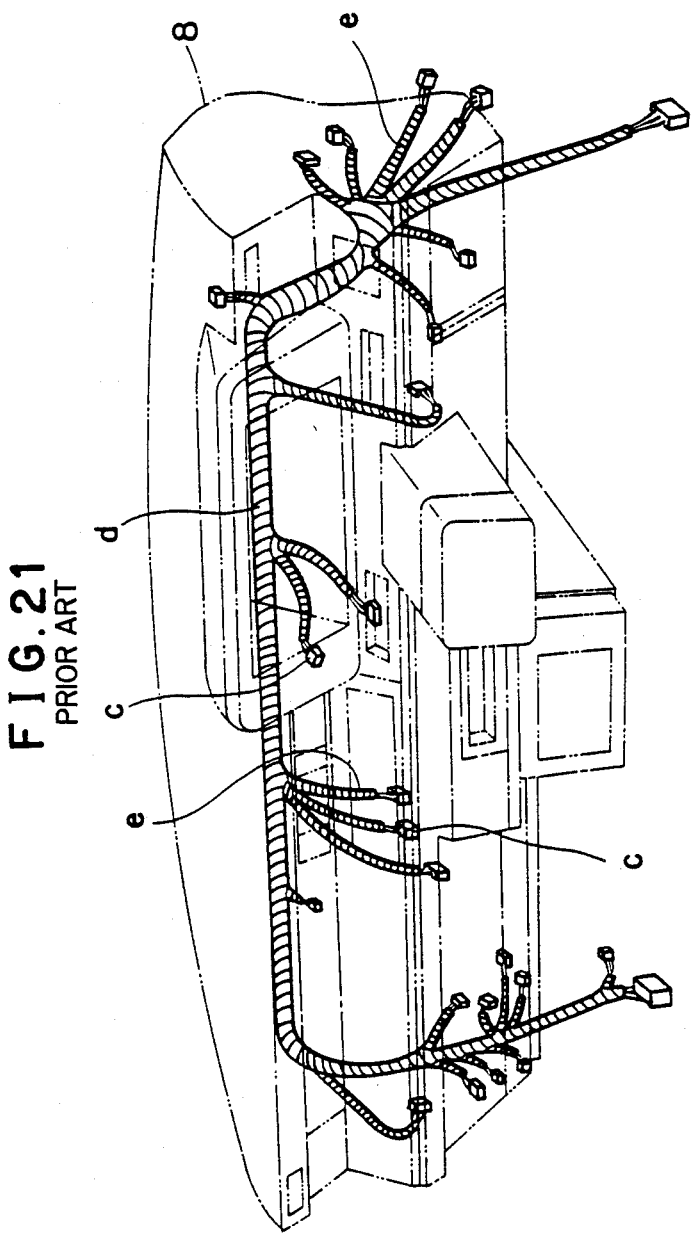
FIG. 21 is a perspective view showing wiring of the conventional wire harness particularly behind the instrument panel.

FIG. 18 illustrates one example of application of this embodiment. In the figure, circuit boards 1 and 1' are wired within a pad of an instrument panel P, and connector-connected to switches and branch wire portion (usual electric wires) e using the connector housing 6. As seen from the drawing, the first circuit board 1 may be used in replace of the main stream section of a wire harness which is conventionally used whereas the second circuit board 1' may be used for the branch section thereof.

Although two circuit patterns A and B are piled up in a check striped-shape in the this embodiment, it will be easily understood that these patterns 1 and 1' may be piled up in three layers or more at a desired position.

Since the present invention is constituted as described in the foregoing, the following effects are obtained.

(1) A wire harness normally formed of a number of electric wires bundled together is replaced with a conductive strip member of a narrow band shape and an insulator substrate for supporting thereof. Accordingly, the insulator substrate can be made thin, and vinyl tapes, clamps, etc. for binding are no longer required. Thus, the wire harness as a whole can be made light in weight and small in size.

(2) Since the circuit board is a thin board similar to a printed circuit board, it can be integrally built in the floor, wall, or articles of a vehicle body. Thus, a space so far required for wiring can be either totally eliminated or reduced extensively.

(3) The circuit board can be built therein with a circuit pattern corresponding to a desired wiring path of the wire harness. Accordingly, working processes required for jointing, etc. heretofore, and mounting processes of the wire harness in production line can be reduced extensively. Thus, productivity is rapidly increased.

(4) Various connecting means are applicable to the circuit boards by interlayer connection boards. Accordingly, additional connection of a sub-harness to a main harness, and design and manufacture per each circuit pattern are easily obtained.

(5) By installing the circuit boards piled up in layers at every important portion, the wire harness can be assembled in a cassette manner.

Although the present invention has been described in a form of preferred embodiments, it will be appreciated that many modifications will readily occur to those skilled in the art without departing from the spirit and scope of the present invention.

What is claimed is:

1. A circuit board construction for use as an automotive vehicle wire harness having a main electrical circuit section and branch electrical circuit sections; said circuit board construction comprising:

a main circuit board structure including a single first insulative substrate having first and second sides, and a plurality of straight conductive strip members thereon on a selected one of said first and second sides of the first insulative substrate substantially parallel with each other, the main circuit board having a generally elongate and straight shape defining the main conductive electrical route of current to loads lined up within the automotive vehicle, a plurality of second, separately formed, straight, insulative substrates each having first and second sides, and at least one straight conductive strip member on a selected one of said first and second sides thereof, said plurality of second straight insulative substrates overlapping said single first insulative substrate transverse thereto, an electrical connection between said at least one straight conductive strip member of each second straight insulative substrate and a selected one of said plurality of straight conductive strip members of the first straight insulative substrate so that said at least one straight conductive strip member of each second straight insulative substrate defines a branch conductor away from the main conductive route, said plurality of second straight insulative substrates and at least one straight conductive strip member thereon having a length and shape predetermined to extend perpendicularly from the selected one straight conductive strip member on the first insulative substrate to a selected load in the vehicle structure for electrical connection thereto as a branch conductive route from the main conductive route to the selected load.

2. A laminated circuit board automotive vehicle wire harness composed of a main electrical circuit section and at least one electrical branch circuit section within an automotive vehicle structure, comprising a plurality of separately formed insulative substrates having first and second sides, each insulative substrate generally having an elongate and straight shape conforming to the predetermined electrical connections and location of loads lined up in the vehicle, and a plurality of straight conductive strip members provided on a selected one of said first and second sides of each insulative substrate of said plurality of substrates, said plurality of conductive strip members being arranged substantially parallel with each other and forming a plurality of circuit patterns, said plurality of insulative substrates overlapping with insulative substrates and straight conductive strip members alternating where they overlap, a first of said insulative substrates and its straight conductive strip members being the main circuit section of the circuit board, extending substantially along loads lined up in the automobile structure, and a plurality of second insulative substrate being a branch circuit section of the board, overlapping said first insulative substrate, and projecting transverse to said first insulative substrate, at least one of said plurality of straight conductive strip members of said first insulative substrate being connected to at least one of said plurality of straight conductive strip members of each second insulative substrate, said connected conductive strip members of said each second insulative substrate being transverse to the conductive strip to which it is connected on the first insulative substrate, and forming the branch circuit section transversely projecting and electrically connecting a selected load in the automobile structure with the main circuit formed by the at least one straight conductive strip on the first insulative substrate.

3. A method of wiring an automotive vehicle including the steps of:
providing a single first main, electrical, circuit section insulative substrate having parallel conductive strip members thereon including providing the substrate and conductive strip members with a generally elongate and straight shape determined to provide electrical service among loads positioned on the automotive vehicle,
providing a plurality of second insulative substrates each having parallel conductive strip members thereon including providing a straight shape of said each second insulative substrate and its conductive strip members to extend transversely from the location of the first insulative substrate to at least one load installed on the automotive vehicle,
securing the first and second insulative substrates and their respective conductive strips in the automotive vehicle with each second insulative substrate overlapping the first conductive substrate and extending transversely therefrom to said load,
electrically connecting at least one of the conductive strip members of each second insulative substrate with at least one of the conductive strip members of the first insulative substrate where the substrates overlap, and
electrically connecting the at least one conductive strip member of the second insulative substrate with said load.

4. A circuit board construction for use as an automotive vehicle wire harness having a main electrical circuit section and branch electrical circuit sections; said circuit board construction comprising:

a main circuit board structure including a first insulative substrate having first and second sides, and a plurality of straight conductive strip members thereon on a selected one of said first and second sides of the first insulative substrate substantially parallel with each other, the main circuit board having a generally elongate and straight shape defining the main conductive electrical route of current to loads lined up within the automotive vehicle, and adapted to be integrally built into a structural portion of the automotive vehicle before assembly of the automotive vehicle, a plurality of second, separately formed, straight insulative substrates each having first and second sides, and at least one straight conductive strip member on a selected one of said first and second sides thereof, said plurality of second straight insulative substrates adapted to be integrally built into a structural portion of the automotive vehicle before assembly of the automotive vehicle, an electrical connection, upon assembly of the automotive vehicle, between said at least one straight conductive strip member of each second straight insulative substrate and a selected one of said plurality of straight conductive strip members of the first straight insulative substrate so that said at least one straight conductive strip member of each second straight insulative substrate defines a branch conductor away from the main conductive route, said plurality of second straight insulative substrates and at least one straight conductive strip member thereon having a length and shape, consistent with a structural portion of the automotive vehicle into which it is built, and also predetermined to extend perpendicularly from the selected one straight conductive strip member on the first insulative substrate with its structural portion of the automotive vehicle, to a selected load in the vehicle for electrical connection thereto, upon assembly of the automotive vehicle, as a branch conductive route from the main conductive route to the selected load.

5. A circuit board construction according to claim 4, wherein the assembled main and branch electrical circuit sections are formed in conformity with the structural portion of the automobile to which they are secured, said sections having surface contours conforming to curves of that structural portion and resting flat thereon, whereby little additional space is taken by or must be provided for the circuit board construction.

6. A circuit board construction according to claim 5, wherein the structural portion is the dashboard structure, the main section extending lengthwise thereof, and the branch sections extending transversely thereof away from said main section and curving in conformity with the dash board structure to further connections proximate the dashboard.

7. A circuit board construction according to claim 4, wherein the circuit board is a multi-layer board formed as a unitary integral part of an assembly including a foam cushioning and structural portion underlying and supporting the foam cushion and the circuit board, the circuit board conforming to the surface contours of the underlying supporting structural portion, and being substantially covered by said foam.

* * * * *

UNITED STATES PATENT AND TRADEMARK OFFICE
CERTIFICATE OF CORRECTION

PATENT NO. : 4,831,278

DATED : May 16, 1989

INVENTOR(S) : Ueda et al.

It is certified that error appears in the above-identified patent and that said Letters Patent is hereby corrected as shown below:

On the title page, under item [30] Foreign Application priority Data, last line, "Sept. 28, 1985" should read --Sep. 28, 1984--;

under item [56] References Cited, U.S. PATENT DOCUMENTS, first column, penultimate line, "Ander et al." should read --Andre et al.--;

under item [56] Reference Cited, OTHER PUBLICATIONS, second column, penultimate line, "190 3" should read --#3--;

under item [57], ABSTRACT, should read
--A circuit board which is composed of an insulator substrate and a plurality of conductive strip members provided thereon for replacing at least a part of a wire harness, the conductive strip members being arranged on the insulator substrate in a parallel arrangement which corresponds to the bundling of wires in a wire harness. By providing branch paths extending from the conductive strip members, the circuit board can replace a substantial part of the wire harness--;

Column 1, line 32, after "Prior" insert --art--;

Column 1, line 32, "harness" should read --harnesses--;

Column 5, line 62, insert a coma after "auxiliaries";

Column 6, line 19, "sub-harness 12" should read --sub-harness 13--;

UNITED STATES PATENT AND TRADEMARK OFFICE
CERTIFICATE OF CORRECTION

PATENT NO. : 4,831,278

DATED : May 16, 1989

INVENTOR(S) : Ueda et al.

It is certified that error appears in the above-identified patent and that said Letters Patent is hereby corrected as shown below:

Column 7, line 48, "replace" should read --place--.

Signed and Sealed this

Sixteenth Day of October, 1990

*Attest:*

HARRY F. MANBECK, JR.

*Attesting Officer*  *Commissioner of Patents and Trademarks*